United States Patent [19]

Bertotti et al.

[11] Patent Number: 4,887,141
[45] Date of Patent: Dec. 12, 1989

[54] SATURATION LIMITING SYSTEM FOR A VERTICAL, ISOLATED COLLECTOR PNP TRANSISTOR AND MONOLITHICALLY INTEGRATED STRUCTURE THEREOF

[75] Inventors: Franco Bertotti, Milan; Paolo Ferrari, Gallarate; Maria T. Gatti, Milan, all of Italy

[73] Assignee: SGS-Thomson Microelectronics s.r.l., Brianza, Italy

[21] Appl. No.: 260,236

[22] Filed: Oct. 19, 1988

[30] Foreign Application Priority Data

Oct. 21, 1987 [IT] Italy ................................ 83666 A/87

[51] Int. Cl.[4] .................... H01L 29/72; H01L 27/02; H01L 27/04
[52] U.S. Cl. ........................................ 357/36; 357/44; 357/48
[58] Field of Search ...................... 357/34, 36, 46, 44, 357/48

[56] References Cited

U.S. PATENT DOCUMENTS

| | | | |
|---|---|---|---|
| 3,502,951 | 3/1970 | Hunts | 357/44 |
| 3,930,909 | 1/1976 | Schmitz et al. | 357/44 |
| 4,038,680 | 7/1977 | Yagi et al. | 357/44 |
| 4,291,319 | 9/1981 | Carinalli | 357/36 |
| 4,394,625 | 7/1983 | Sakai | 357/44 |
| 4,476,480 | 10/1984 | Fuse | 357/44 |

Primary Examiner—Gene M. Munson
Attorney, Agent, or Firm—Bierman and Muserlian

[57] ABSTRACT

The structure of a vertical PNP transistor with isolated collector is modified by forming a P-type diffusion outside the perimeter of a sinker collector diffusion to form an auxiliary collector capable of detecting the injection of current toward the substrate when the integrated transistor saturates. The current gathered by said auxiliary collector is used for activating a saturation limiting circuit formed by an NPN transistor which is switched-on when said said current gathered by said auxiliary collector reaches a threshold value and which in turn switches-on a PNP transistor having an emitter and a collector connected respectively to the emitter and to the base of the PNP vertical transistor with isolated collector for reducing the driving base current thereto.

4 Claims, 1 Drawing Sheet 4,887,141

SATURATION LIMITING SYSTEM FOR A VERTICAL, ISOLATED COLLECTOR PNP TRANSISTOR AND MONOLITHICALLY INTEGRATED STRUCTURE THEREOF

BACKGROUND OF THE INVENTION

1. Field of the Invention

The present invention relates to integrated circuits and in particular to power output stages utilizing vertical PNP transistors with isolated collector.

2. Description of the Prior Art

In integrated circuits driving external inductive and/or capacitive loads by means of output power stages, a saturation condition may take place whereupon the collector of an output transistor cannot deliver to the external load the whole current as driven through the base (i.e. $Ic = \beta\ Ib$). A situation of this kind may happen for example when the collector of the output transistor is disconnected from the load or when the load is an inductance uncapable of taking the necessary current.

Furthermore, if the output stage is made using a vertical PNP transistor having a collector isolated from ground (from the substrate), the collector current of the transistor which is not taken by the load flows to ground (i.e. is injected into the substrate of the integrated circuit) through a parasitic PNP transistor whose structure is intrinsic to the structure of a vertical PNP transistor with isolated collector. This phenomenon is origin of remarkable problems due to:

power dissipation with a consequent increase of the operating temperature of the device;
passage of current through the substrate with attendant probabilities of raising the ground potential (dirtying the ground of the device);
undue current drainage during the switching-on of the integrated circuit.

According to a generally known technique, more or less sophisticated circuits are employed which intervene when the output PNP transistor enters saturation in order to prevent a condition of an excessively deep saturation thereof. The design of these prior art circuits has remarkable critical aspects which must be considered during the designing in order to ensure an adequate precision of the intervention threshold of the antisaturation circuit, besides a relatively large area is necessary for implementing these circuits within the integrated circuit.

OBJECTIVES AND SUMMARY OF THE INVENTION

A main objective of the present invention is to provide a monolithically integrable antisaturation system for preventing deep saturation of a vertical PNP transistor with isolated collector without the drawbacks of the prior art circuits.

It is a further objective of the invention to provide a vertical PNP transistor with isolated collector having a modified structure suitable to permit the realization of a more efficient and advantageous antisaturation system than those of the prior art.

These an other objectives and advantages of the invention are achieved by means of the monolithically integrated circuit for the prevention of a deep saturation of a vertical PNP transistor with isolated collector having a purposely modified structure as defined in the annexed claims.

BRIEF DESCRIPTION OF THE DRAWINGS

The realization and the operation of the system of the present invention as well as the objectives and advantages that are achieved thereby will be better understood through the following description of a particularly preferred embodiment of the invention and the relative drawings, wherein.

DESCRIPTION OF THE PREFERRED EMBODIMENT

Figure 1:
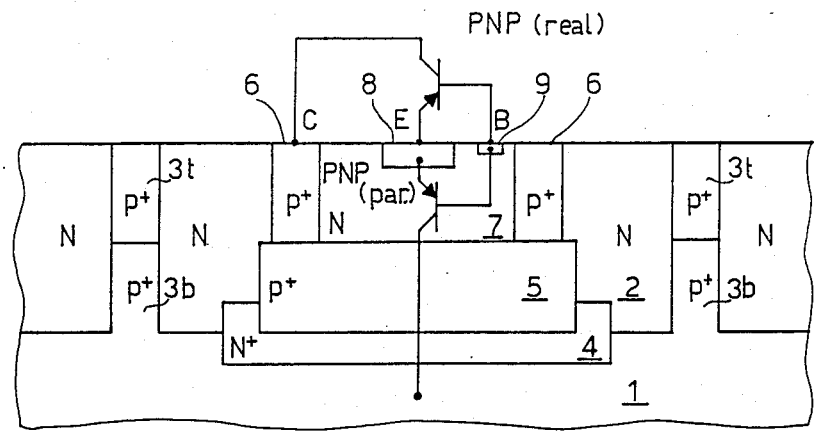
FIG. 1 is a schematic configuration of a monolithically integrated vertical PNP transistor with isolated collector according to the known art.

A typical structure of an integrated PNP transistor with isolated collector is depicted in FIG. 1. In the figure are shown the substrate 1 on which the integrated circuit is fabricated, the N-type epitaxial layer 2, the bottom isolations 3b and the corresponding top isolation diffusions 3t, as well as the N+-type buried layer 4 (also known as "bottom N-Well"), which is formed by implanting phosphorus in the relative area of the substrate 1 before growing the epitaxial layer 2, according to normal practices. Within this region of the epitaxial layer the PNP transistor with isolated collector is realized by forming, by means of a boron implant before the epitaxial layer growth, the P+ type bottom layer 5 which constitutes the collector of the transistor the contact with which is brought to the surface by means of a deep P+ sinker diffusion 6, which completely surrounds a region 7 of the N-type epitaxial layer constituting the base region of the transistor. The base-emitter junction is then formed by diffusing boron in an emitter region 8. The base contact is formed by first forming a N+ base contact region 9. The respective emitter, base and collector contacts are indicated in FIG. 1 by means of the graphic symbol depicting the real transistor (PNP$_{real}$).

Intrinsic to such an integrated structure is the existence of a parasitic transistor (PNP$_{par.}$) which is also graphically depicted in FIG. 1.

It is through the switching-on of such a parasitic transistor, unavoidably intrinsic to the integrated structure of the real transistor and which takes place when the operating conditions are such as to drive the real transistor to a deep saturation condition, that an undesirable leak of current toward the substrate 1 of the integrated circuit occurs with well known attendant negative effects, as previously discussed.

Figure 2:
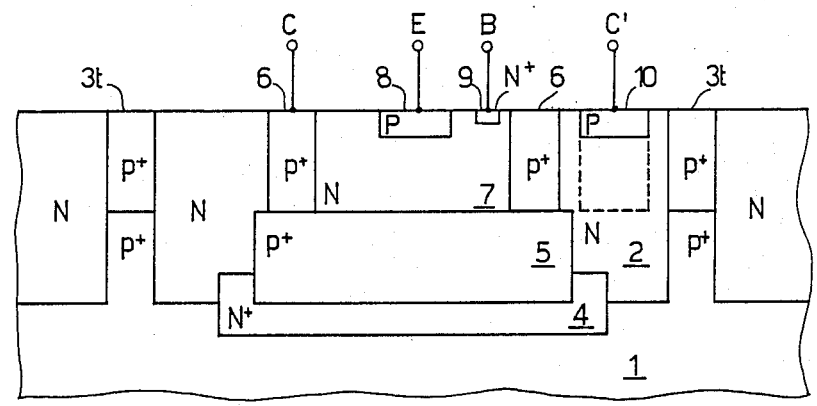
FIG. 2 is a schematic modified structure of the vertical PNP transistor with isolated collector of the invention.

In accordance with the present invention, the integrated structure of a PNP transistor with isolated collector destined to operate in a power gain stage and therefore subject to severe accidental conditions of operation in a state of deep saturation is modified as depicted in FIG. 2, wherein the same numerals already used in FIG. 1 are utilized for indicating equivalent parts.

As it is easily observed by comparing FIG. 1 and FIG. 2, the integrated structure of the present invention of the vertical PNP transistor with isolated collector is substantially identical to the structure of the prior art, with the exception of the addition of an auxiliary collector region C' formed by diffusing boron in a region of the epitaxial layer 2 which is external to the primary collector C region which is formed by the P+ diffusions 6 and 5, and comprised within the overall region of the transistor bounded by the isolations 3b and 3t. This auxiliary collector region is indicated with 10 in FIG. 2 and either the P-type boron diffusion profile already used for forming the emitter region 8 or the P+-type boron diffusion profile utilized for forming the top isolation diffusions 3t (as well as the primary collector C sinker diffusion 6) may be utilized for forming this region 10. In the latter case, the diffusion profile of this auxiliary collector C' diffusion region 10 is indicated by means of a dash line.

Forming this auxiliary collector C' within the integrated structure of the vertical PNP transistor with isolated collector allows to obtain a "sensor" of the existence of an electric current which is being injected toward the substrate when the transistor happens to be driven into saturation.

The connection of the auxiliary collector C' in a circuit for preventing deep saturation of the vertical PNP transistor with isolated collector T1 (PNP) will now be described by making reference to the circuit diagram depicted in FIG. 3.

Essentially the auxiliary collector C' is connected to the input terminal of an antisaturation circuit able to reduce the driving base current of the transistor T1 when, upon the occurence of saturation conditions, said auxiliary collector C' gathers a portion (of a pre-established amount) of the total leakage current which is injected toward the substrate when the PNP transistor enters saturation.

Figure 3:
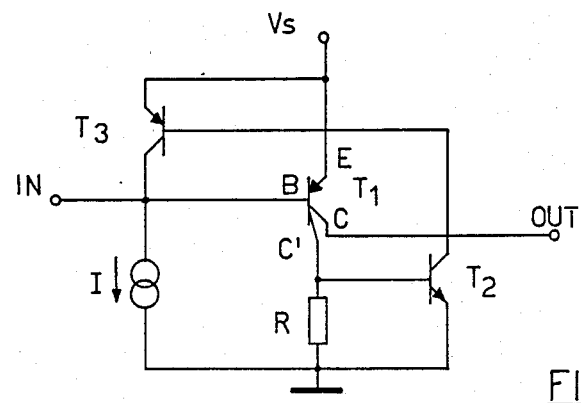
FIG. 3 is a circuit diagram of a modified vertical PNP transistor with isolated collector of FIG. 2 utilized in a gain stage, and wherein the components of the anti-saturation circuit of the invention are depicted.

A particularly preferred embodiment of such an antisaturation circuit is depicted in FIG. 3, wherein the antisaturation circuit is formed by a second transistor T2 (NPN) by a resistor R and by a third transistor T3 (PNP).

The base of the NPN transistor T2 is the input node of the antisaturation circuit to which node the auxiliary collector C' of the integrated PNP transistor with isolated collector of the invention is also connected. The resistor R connected between this input node, i.e. the base of transistor T2, and the ground of the circuit, allows to set the switching-on threshold of transistor T2. Trimming of this resistance must be made in a way as to avoid that transistor T2 switch-on during a normal operation in saturation zone of the transistor T1 at the maximum collector current contemplated when designing the integrated circuit. In this limit case there will be a certain current of a small value which is injected into the substrate.

Upon an accidentally occuring increase of the saturation condition of the transistor T1, the current intercepted by the auxiliary collector C' of the transistor reaches a value such as to determine (having so preset the value of R) the switching-on of the transistor T2 which automatically causes the switching-on of the PNP transistor T3. The switching-on of the latter transistor T3, whose emitter is connected in common with the emitter of the transistor T1 to the supply Vs and whose collector is connected to the base of transistor T1, reduces the base current driving the transistor T1 by providing a portion of the current imposed by the current generator I belonging to the biasing circuit of the transistor T1 which may be operating in a gain stage whose input terminal (IN) is represented by the base of the transistor T1 and whose output terminal (OUT) is represented by the collector C of the transistor T1.

The objectives of the invention are therefore fulfilled. In particular, the deep saturation prevention system of a vertical PNP transistor with isolated collector operating in an output gain stage according to the present invention offers, in respect to the known circuit arrangements, the advantages of requiring as small area and of obviating effectively the trimming difficulties of the antisaturation circuit of the prior art.

What we claim is:

1. A monolithically integrated vertical PNP transistor with isolated collector formed in a N-type epitaxial layer grown on a monocrystalline silicon substrate and comprising at least a buried P+-type collector layer contactable from the surface through a P+-type sinker diffusion completely surrounding a base region of the transistor bounded by said collector buried layer and by said sinker diffusion, a P-type emitter diffusion and an N-type base contact diffusion, both contained within said base region, and an isolation P+-type diffusion extending through the whole thickness of said epitaxial layer surrounding the entire area occupied by the transistor, characterized in that
a P or P+-type diffusion is formed in the epitaxial layer in a zone comprised between said collector sinker diffusion and said isolation diffusion, said P or P+-type diffusion forming an auxiliary collector region of the integrated transistor;

said auxiliary collector being connectable independently from the collector proper of the transistor to an input terminal of an antisaturation circuit capable of reducing a driving base current of the integrated transistor when, upon the occurence of an excessive saturation of the integrated transistor, said auxiliary collector gathers a portion of a preset value of a total leakage current injected toward the substrate by the saturated PNP transistor.

2. A PNP transistor according to claim 1, wherein said diffusion forming said auxiliary collector has the same diffusion profile of said emitter diffusion.

3. A PNP transistor according to claim 1, wherein said diffusion forming said auxiliary collector has the same diffusion profile of said isolation diffusion.

4. A monolithically integrable circuit for preventing deep saturation of a vertical PNP transistor with isolated collector operating as a gain stage, said circuit comprising
a second NPN type transistor, a third PNP type transistor and a resistor connected between the base of said NPN transistor and a first common potential node of the circuit;

said first vertical PNP transistor with isolated collector being provided with an auxiliary collector formed by a P-type diffusion formed outside the perimeter of a P+-type sinker diffusion which with a buried P+-type layer constitutes a main collector of the transistor;

said third PNP-type transistor having an emitter and a collector connected respectively to an emitter and to a base of said first PNP transistor with isolated collector and having a base connected to a collector of said second NPN-type transistor having an emitter and a base which are connected respectively to said first common potential node of the circuit and to said auxiliary collector of said first PNP transistor with isolated collector.

* * * * *